United States Patent [19]

Rijns

[11] Patent Number: 5,394,080
[45] Date of Patent: Feb. 28, 1995

[54] UNIVERSAL SIGNAL CONVERTER USING MULTIPLE CURRENT MIRRORS

[75] Inventor: Johannes J. F. Rijns, Eindhoven, Netherlands

[73] Assignee: U.S. Philips Corporation, New York, N.Y.

[21] Appl. No.: 152,767

[22] Filed: Nov. 15, 1993

[30] Foreign Application Priority Data

Dec. 21, 1992 [EP] European Pat. Off. ........... 92204037

[51] Int. Cl.⁶ .................................................. G05F 3/20
[52] U.S. Cl. ........................................ 323/315; 323/312
[58] Field of Search ................. 323/312, 313, 315, 316

[56] References Cited

U.S. PATENT DOCUMENTS

| | | | |
|---|---|---|---|
| 4,814,724 | 3/1989 | Tanigawa | 323/315 X |
| 4,910,480 | 3/1990 | Crosby | 323/315 X |
| 4,945,259 | 7/1990 | Anderson | 323/315 X |
| 5,057,792 | 10/1991 | Gay | 323/315 X |

OTHER PUBLICATIONS

International Journal of Electronics, vol. 65, No. 6, Dec. 1988, pp. 1137–1142, A Translinear Floating Current-Source with Current-Control.
1992 IEEE International Symposium on Circuits and Systems, vol. 3 of 6, 10 May 1992, pp. 1372–1375, Wide Gm Adjustment Range, Highly Linear Ota with Linear Programmable Current Mirrors.

*Primary Examiner*—Steven L. Stephan
*Assistant Examiner*—Y. Jessica Han
*Attorney, Agent, or Firm*—Bernard Franzblau

[57] ABSTRACT

A universal signal converter composed of a first current mirror having a first input terminal adapted to receive a first input signal and a first output terminal. A first common terminal is coupled to a first reference terminal. The signal converter is adapted to receive a second input signal via the first output terminal. The converter further comprises a second current mirror having a second input terminal coupled to a second reference terminal, a second output terminal adapted to supply a first output signal, and a second common terminal coupled to the first output terminal. A third current mirror has a third input terminal coupled to the second reference terminal and a third output terminal adapted to supply a second output signal. A third common terminal is coupled to the first input terminal and a bias current source is coupled between the second and the third input terminal and the second reference terminal.

11 Claims, 1 Drawing Sheet

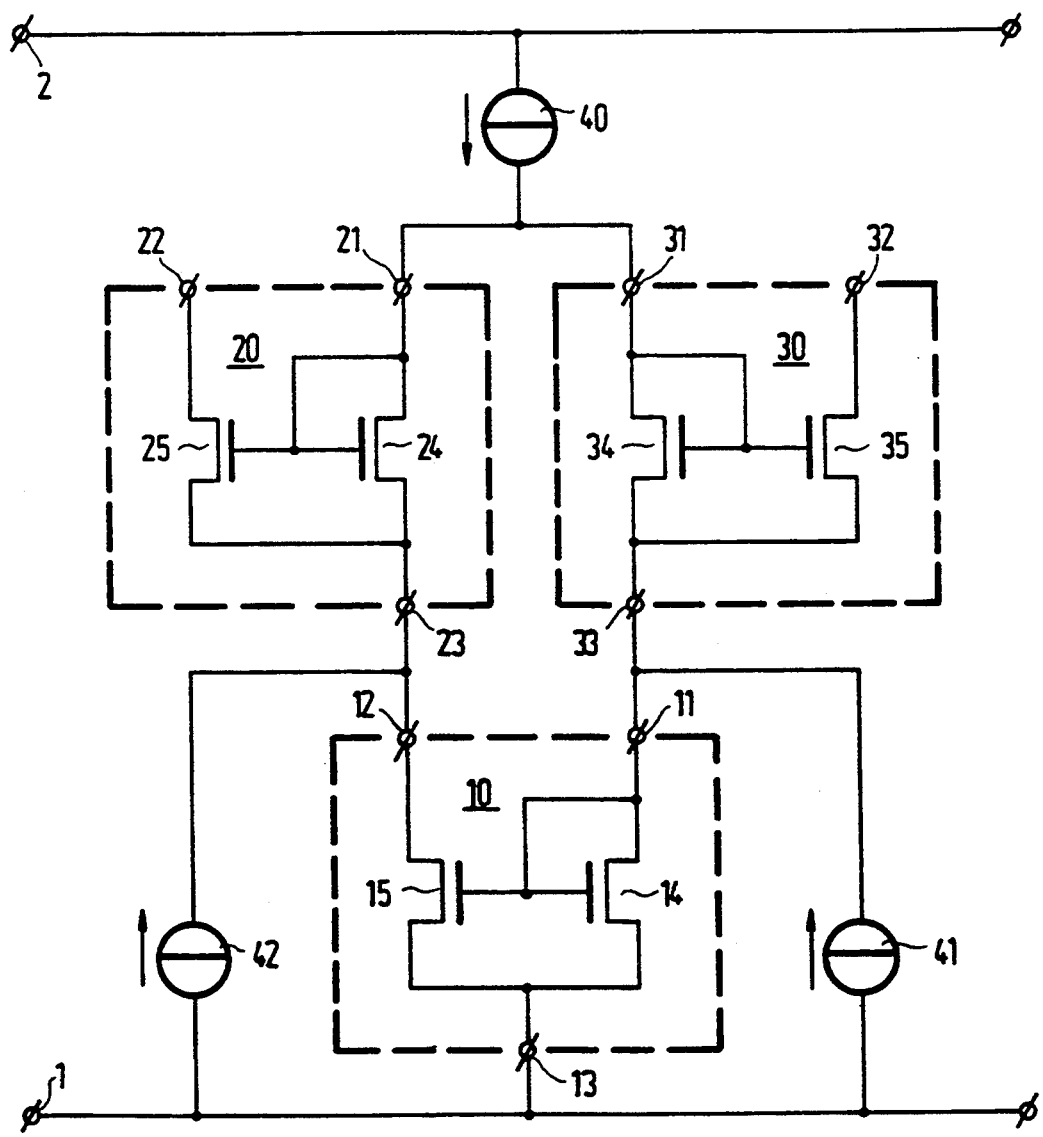

UNIVERSAL SIGNAL CONVERTER USING MULTIPLE CURRENT MIRRORS

BACKGROUND OF THE INVENTION

This invention relates to a signal converter comprising a first reference terminal adapted to receive a first reference voltage and a first current mirror having a first input terminal adapted to receive a first input signal, having a first output terminal, and having a first common terminal coupled to the first reference terminal.

Such a signal converter can be used universally in integrated semiconductor circuits, particularly for converting an input current into an output current.

A known example of such a signal converter is a current mirror arrangement comprising an input transistor having a control electrode coupled to the first input terminal and a having a main current path coupled between the first input terminal and the first common terminal, and an output transistor having a control electrode coupled to the control electrode of the input transistor and having a main current path coupled between the first output terminal and the first common terminal. The first input signal can be applied to the known signal converter as an (input) voltage or an (input) current. When the first input signal is applied as an (input) voltage between the first input terminal and the common terminal, the (input) voltage generates an (input) current via the first input terminal and an (output) current via the first output terminal. When the first input signal is applied to the first input terminal as an (input) current, the (input) current generates an (input) voltage between the first input terminal and the first common terminal and the generated (input) voltage generates an (output) current via the first output terminal.

However, regardless of the first input signal (i.e. either an (input) voltage or an (input) current) the known signal converter generates a single (output) current via the first output terminal, which single (output) current depends proportionally on the first input signal.

A disadvantage of the known signal converter is that this signal converter is not capable of converting a single input signal into a differential output signal and a differential input signal into a differential output signal.

SUMMARY OF THE INVENTION

It is an object of the invention to provide a signal converter which effects a single-to-differential conversion or a differential-to-differential conversion depending on the input signal and which has a linear conversion characteristic which is independent of the type of conversion.

A signal converter in accordance with the invention is characterized in that the first output terminal is adapted to receive a second input signal, and the signal converter further comprises a second reference terminal for receiving a second reference voltage, a second current mirror having a second input terminal coupled to the second reference terminal, a second output terminal adapted to supply a first output signal, and a second common terminal coupled to the first output terminal. A third current mirror has a third input terminal coupled to the second reference terminal, a third output terminal adapted to supply a second output signal, and has a third common terminal coupled to the first input terminal. A bias current source is coupled between the second and the third input terminal and the second reference terminal. Since the second and the third current mirror and the bias current source have been added to the known converter, the signal converter in accordance with the invention is capable of realizing a single-to-differential conversion and a differential-to-differential conversion. A simple adaptation of the signal converter in accordance with the invention also makes this converter suitable for realizing a single-to-single conversion and a differential-to-single conversion. These conversions will be explained with reference to the accompanying Figure. In this explanation it will also be outlined that the signal converter in accordance with the invention has a linear conversion characteristic regardless of the type of conversion.

A further embodiment of a signal converter in accordance with the invention is characterized in that the first current mirror comprises a first input transistor having a control electrode coupled to the first input terminal and having a main current path coupled between the first input terminal and the first common terminal, and a first output transistor having a control electrode coupled to the control electrode of the first input transistor and having a main current path coupled between the first output terminal and the first common terminal, the second current mirror comprises a second input transistor having a control electrode coupled to the second input terminal and having a main current path coupled between the second input terminal and the second common terminal, and a second output transistor having a control electrode coupled to the control electrode of the second input transistor and having a main current path coupled between the second output terminal and the second common terminal, and the third current mirror comprises a third input transistor having a control electrode coupled to the third input terminal and having a main current path coupled between the third input terminal and the third common terminal, and a third output transistor having a control electrode coupled to the control electrode of the third input transistor and having a main current path coupled between the third output terminal and the third common terminal. The present signal converter in accordance with the invention is a simple embodiment which may comprise transistors of a unipolar or of a bipolar type.

BRIEF DESCRIPTION OF THE DRAWINGS

These and other (more detailed) aspects of the invention will now be described and elucidated more elaborately with reference to the accompanying Figure, in which:

The single Figure shows an embodiment of a signal converter in accordance with the invention.

DESCRIPTION OF THE PREFERRED EMBODIMENTS

The accompanying Figure shows an embodiment of a signal converter in accordance with the invention. In accordance with the invention the signal converter shown comprises a first reference terminal 1, a second reference terminal 2, a first current mirror 10, a second current mirror 20, a third current mirror 30, and a bias current source 40. The current mirror 10 has a first input terminal 11, a first output terminal 12, and a first common terminal 13, which common terminal is coupled to the reference terminal 1. The current mirror 20 has a second input terminal 21, which input terminal is coupled to the reference terminal 2, a second output terminal 22, and a second common terminal 23, which common terminal is coupled to the output terminal 12. The current mirror 30 has a third input terminal 31, which input terminal is coupled to the reference terminal 2, a third output terminal 32, and a third common terminal 33, which common terminal is coupled to the input terminal 11. The bias current source 40 is coupled between the input terminals 21, 31 and the reference terminal 2. To illustrate a possible implementation of the signal converter in accordance with the invention, the current mirrors 10, 20 and 30 in the present embodiment are implemented in a simple manner. A simple implementation of the current mirror 10 comprises a first input transistor 14 having a control electrode coupled to the input terminal 11 and having a main current path coupled between the input terminal 11 and the common terminal 13, and a first output transistor 15 having a control electrode coupled to the control electrode of the input transistor 14 and having a main current path coupled between the output terminal 12 and the common terminal 13. A simple implementation of the current mirror 20 comprises a second input transistor 24 having a control electrode coupled to the input terminal 21 and having a main current path coupled between the input terminal 21 and the common terminal 23, and a second output transistor 25 having a control electrode coupled to the control electrode of the input transistor 24 and having a main current path coupled between the output terminal 22 and the common terminal 23. A simple implementation of the current mirror 30 comprises a third input transistor 34 having a control electrode coupled to the input terminal 31 and having a main current path coupled between the input terminal 31 and the common terminal 33, and a third output transistor 35 having a control electrode coupled to the control electrode of the input transistor 34 and having a main current path coupled between the output terminal 32 and the common terminal 33. The aforementioned transistors (14, 15, 24, 25, 34, 35) may be of a unipolar or bipolar type and they may be of an N conductivity type or P conductivity type.

When a first reference voltage is applied to the reference terminal 1 and a second reference voltage is applied to the reference terminal 2, the signal converter in accordance with the invention can be used for converting a single input signal into a single output signal, a single input signal into a differential output signal, a differential input signal into a single output signal, and a differential input signal into a differential output signal. To illustrate the possible implementation of the signal converter in accordance with the invention, the present converter is constructed to convert a differential input signal comprising a first input current and a second input current into a differential output signal comprising a first output current and a second output current, a positive voltage difference being provided between the reference terminals 1 and 2.

The first input current is applied to the input terminal 11 by means of a signal current source 41 and the second input current is applied to the input terminal 12 by means of a signal current source 42, the first output current being available at the output terminal 22 and the second output current being available at the output terminal 32. Although the present converter is adapted to convert a differential input signal into a differential output signal, a functional description of the signal converter in accordance with the invention will be given for a differential-to-differential conversion as well as for a single-to-differential conversion.

In the case of the differential-to-differential conversion the signal converter may be constructed as shown in the accompanying Figure. In the relevant embodiment the bias current source 40 generates a bias current through the input transistors 14 and 34, in response to which current a voltage is generated across the respective transistors, the voltage across the input transistor 14 generating a bias current through the output transistor 15 and the voltage across the input transistor 34 generating a bias current through the output transistor 35. The bias current through the output transistor 15 causes a bias current to be generated through the input transistor 24, in response to which current a voltage is produced across the input transistor 24, the voltage across the input transistor 24 generating a bias current through the output transistor 25. Since the sum of the bias current through the transistors 14 and 34 and the bias current through the transistors 15 and 24 is determined by the bias current of the bias current source 40, all of the bias currents are determined by the bias current of the bias current source 40. In a first case of a positive input current at the input terminal 11 and a negative input current at the output terminal 12 the current mirror 10 ensures that the current through the transistors 14 and 15 remains the same, whereas the current through the input transistor 34 decreases and the current through the input transistor 24 increases. As a result of this and also as a result of the respective current mirrors 30 and 20, the output current through the output transistor 35 decreases and the output current through the output transistor 25 increases. Since, in a second case of a negative input current at the input terminal 11 and a positive input current at the output terminal 12 the signal converter provides a similar behaviour and the present converter realizes a differential-to-differential conversion.

In the case of a single-to-differential conversion the signal converter differs from the converter shown in that the signal current 42 is dispensed with. Although the bias currents in the resulting converter do not differ from the bias currents in the converter shown, the input current causes a different signal behaviour. In a first case of a positive input current at the input terminal 11 the current through the input transistor 14 increases and the current through the output transistor 15 increases accordingly owing to the presence of the current mirror 10. As a result, the current through the input transistor 24 increases and the output current through the output transistor 25 increases accordingly owing to the presence of the current mirror 20. However, as the sum of the current through the transistors 15 and 24 and the current through the transistors 14 and 34 is determined by the bias current of the bias current source 40, the current through the input transistor 34 decreases and the output current through the output transistor 35 decreases accordingly owing to the presence of the current mirror 30. As in a second case of a negative input current at the input terminal 11 the signal converter exhibits a similar behaviour and the present converter provides the single-to-differential conversion. The signal converter in accordance with the invention has a linear conversion characteristic regardless of the type of conversion. The relevant conversion characteristic results from the (substantially) symmetrical construction of the signal converter. When the signal converter in accordance with the invention is implemented by means of transistors of the unipolar type a maximum linearity is obtained, which maximum linearity results from the (absence of) control electrode currents. When the signal converter in accordance with the invention is constructed by means of current mirrors having a mirror factor, the signal converter can provide gain or attenuation. A current mirror having a mirror factor is obtained when the respective input transistor and output transistor have different emitter or source areas.

The invention is not limited to the embodiment shown herein. Within the scope of the invention an unlimited number of modifications are conceivable to those skilled in the art. One possible modification is the provision of a connection between the second or the third output terminal and the second reference terminal, as a result of which connection a single-to-single conversion or a differential-to-single conversion is obtained. Another modification involves the application of an input signal in the form of an (input) voltage, which (input) voltage results in a current behaviour corresponding to that described above. A further modification concerns the take-off of an output signal in the form of an (output) voltage, which is possible when the second and the third output terminals are coupled to the second reference terminal by means of a respective impedance.

As a result, the signal converter in accordance with the invention can be constructed to realize a current-to-current conversion, a current-to-voltage conversion, a (non-linear) voltage-to-current conversion, or a non-linear voltage-to-voltage conversion.

I claim:

1. A signal converter comprising a first reference terminal adapted to receive a first reference voltage and a first current mirror having a first input terminal adapted to receive a first input signal, having a first output terminal, and having a first common terminal coupled to the first reference terminal, wherein the first output terminal is adapted to receive a second input signal, and the signal converter further comprises a second reference terminal for receiving a second reference voltage, a second current mirror having a second input terminal coupled to the second reference terminal, a second output terminal adapted to supply a first output signal, and a second common terminal coupled to the first output terminal, a third current mirror has a third input terminal coupled to the second reference terminal, a third output terminal adapted to supply a second output signal, and a third common terminal coupled to the first input terminal, and wherein a bias current source is coupled between the second and the third input terminal and the second reference terminal.

2. A signal converter as claimed in claim 1, wherein the first current mirror comprises a first input transistor having a control electrode coupled to the first input terminal and having a main current path coupled between the first input terminal and the first common terminal, and a first output transistor having a control electrode coupled to the control electrode of the first input transistor and having a main current path coupled between the first output terminal and the first common terminal, the second current mirror comprises a second input transistor having a control electrode coupled to the second input terminal and having a main current path coupled between the second input terminal and the second common terminal, and a second output transistor having a control electrode coupled to the control electrode of the second input transistor and having a main current path coupled between the second output terminal and the second common terminal, and the third current mirror comprises a third input transistor having a control electrode coupled to the third input terminal and having a main current path coupled between the third input terminal and the third common terminal, and a third output transistor having a control electrode coupled to the control electrode of the third input transistor and having a main current path coupled between the third output terminal and the third common terminal.

3. A signal converter as claimed in claim 2 wherein said transistors of the first, second and third current mirrors are all of the same conductivity type.

4. A signal converter as claimed in claim 1 wherein one of said second and third output terminals is directly connected to the second reference terminal thereby to provide a differential-to-single conversion characteristic for the signal converter.

5. A signal converter as claimed in claim 1 wherein said first output terminal does not receive a second input signal thereby to provide a single-to-differential conversion characteristic for the signal converter.

6. A universal signal converter having a linear conversion characteristic comprising:
first and second reference voltage terminals,
first, second and third current mirrors each having an input current path and an output current path coupled to a common terminal thereof,
a bias current source,
first means coupling the output current path of the first current mirror, the input current path of the second current mirror, and the bias current source in a first series circuit between said first and second reference voltage terminals,
second means coupling the input current path of the first current mirror, the input current path of the third current mirror, and the bias current source in a second series circuit between said first and second reference voltage terminals,
a signal input terminal coupled to a node between the input current paths of the first and third current mirrors, and
a first signal output terminal coupled to the output current path of one of said second and third current mirrors.

7. A universal signal converter as claimed in claim 6 further comprising a second signal output terminal coupled to the output current path of the other one of said second and third current mirrors.

8. A universal signal converter as claimed in claim 7 further comprising a second signal input terminal coupled to a node between the output current path of the first current mirror and the input current path of the second current mirror.

9. A universal signal converter as claimed in claim 8 wherein the input current paths of the first, second and third current mirrors comprise respective diode-connected transistors and the output current paths of the first, second and third current mirrors comprise respective further transistors having control electrodes connected to control electrodes of their respective diode-connected transistors, said further transistors in the second and third current mirrors being coupled to the first and second signal output terminals, respectively, and to respective common terminals of the second and third current mirrors.

10. A universal signal converter as claimed in claim 7 wherein the input current paths of the first, second and third current mirrors comprise respective diode-connected transistors and the output current paths of the first, second and third current mirrors comprise respective further transistors having control electrodes connected to control electrodes of their respective diode-connected transistors, said further transistors in the second and third current mirrors being coupled to the first and second signal output terminals, respectively, and to respective common terminals of the second and third current mirrors.

11. A universal signal converter as claimed in claim 6 further comprising a second signal input terminal coupled to a node between the output current path of the first current mirror and the input current path of the second current mirror.

* * * * *